United States Patent
Shimizu et al.

(10) Patent No.: US 8,564,060 B2
(45) Date of Patent: Oct. 22, 2013

(54) SEMICONDUCTOR DEVICE WITH LARGE BLOCKING VOLTAGE AND MANUFACTURING METHOD THEREOF

(75) Inventors: Haruka Shimizu, Kodaira (JP); Natsuki Yokoyama, Mitaka (JP)

(73) Assignee: Hitachi, Ltd., Tokyo (JP)

( * ) Notice: Subject to any disclaimer, the term of this patent is extended or adjusted under 35 U.S.C. 154(b) by 85 days.

(21) Appl. No.: 12/834,764

(22) Filed: Jul. 12, 2010

(65) Prior Publication Data

US 2011/0018004 A1     Jan. 27, 2011

(30) Foreign Application Priority Data

Jul. 21, 2009   (JP) .................................. 2009-169693

(51) Int. Cl.
*H01L 29/66*     (2006.01)

(52) U.S. Cl.
USPC ........... 257/342; 257/330; 257/331; 257/332; 257/E21.41; 257/E21.418; 438/137; 438/136; 438/138

(58) Field of Classification Search
USPC .................... 257/332, 341, E21.41, E21.375, 257/E21.418, E21.447, E21.609, E21.612, 257/E21.629, E21.643, E21.652, E21.676, 257/E21.693, E29.262, E29.274, E29.313, 257/E29.318, 342; 438/137–138, 156, 173, 438/192, 206, 209, 268

See application file for complete search history.

(56) References Cited

U.S. PATENT DOCUMENTS

| | | | |
|---|---|---|---|
| 5,708,286 A | | 1/1998 | Uesugi et al. |
| 7,038,275 B2 * | | 5/2006 | Kushida .......................... 257/342 |
| 2009/0280609 A1 * | | 11/2009 | Akiba et al. .................. 438/270 |

FOREIGN PATENT DOCUMENTS

| | | |
|---|---|---|
| JP | 05-110091 A | 4/1993 |
| JP | 3319215 B2 | 6/2002 |

* cited by examiner

*Primary Examiner* — Steven Loke
*Assistant Examiner* — Cuong B Nguyen
(74) *Attorney, Agent, or Firm* — Miles & Stockbridge P.C.

(57) ABSTRACT

There is no effective method for fabricating a semiconductor power device containing UMOSFET possessing large channel mobility and whose threshold voltage can be lowered with no loss in blocking voltage. A semiconductor device with large blocking voltage is provided utilizing silicon carbide trench MOSFET possessing both narrow regions where the p body concentration is low, and wide regions where the p body concentration is high.

9 Claims, 10 Drawing Sheets

SEMICONDUCTOR DEVICE WITH LARGE BLOCKING VOLTAGE AND MANUFACTURING METHOD THEREOF

CLAIM OF PRIORITY

The present application claims priority from Japanese patent application JP 2009-169693 filed on Jul. 21, 2009 the content of which is hereby incorporated by reference into this application.

FIELD OF THE INVENTION

The present invention relates to a power semiconductor device whose threshold voltage can be lowered with no loss of blocking voltage even if the device is formed from UMOS-FET.

BACKGROUND OF THE INVENTION

The specific ON-resistance and the blocking voltage in semiconductor power devices are subject to a trade-off relation determined by the bandgap of the material used in the substrate. One effective method for attaining better performance than power devices containing silicon is to use a substrate material whose bandgap is larger than silicon. Silicon carbide (SiC) is the special focus of much attention as a substrate material because of features such as a satisfactorily wide bandgap approximately three times larger than silicon, easily formable p-type and n-type conductance regions, and oxidized film formed by thermal oxidation. These SiC features offer new possibilities for devices including high-performance MOSFET (Metal Oxide Semiconductor Field Effect Transistor) devices.

Among the various power devices, vertical power MOSFET are utilized in a wide range of areas because of their excellent switching characteristics. Vertical power MOSFET devices are broadly grouped into two types: DMOSFET and UMOSFET. The DMOSFET (depletion MOSFET) is a simple structure with the channels formed on the substrate surface and so is comparatively easy to produce and has an effective blocking voltage however it has the drawbacks of a large cell pitch and large channel resistance. The UMOSFET on the other hand is a comparatively complex structure with the channels formed on the trench side wall and features such as a small cell pitch and a small channel resistance. Because of these features, there is growing trend to shift from DMOSFET to UMOSFET.

However use of silicon carbide UMOSFET reveals the serious problem that channel mobility is extremely small. Causes of small channel mobility include the forming of an interface state where carbon remains on the boundary where the silicon carbide was thermal-oxidized, and a loss of sliding effect on trench side wall surfaces formed by dry etching. Both of these causes differ greatly compared to use of silicon material. When the interface state becomes larger, coulomb scattering increases due to charges trapped on the boundary, and when the trench side wall surface is no longer slippery then scattering increases due to interface (boundary) roughness. These conditions cause a drastic drop in channel mobility.

Modifying the manufacturing process can render improvements to a certain extent but attaining improvements on the same level as silicon is impossible. Attaining the same improvement level is difficult because completely removing carbon from the boundary is impossible since there is carbon within the substrate, as well as the fact that physical properties are greatly different from silicon in that silicon carbide is extremely hard and difficult to machine, and moreover does not easily re-crystallize.

If channel mobility is low then other measures can be utilized to reduce channel resistance. Such measures may for example include shortening the channel length, or reducing the density of the p body region forming the channels in order to lower the threshold voltage. However, shortening the channel length shortens the distance between the drift layer and the source region so that punch-through tends to easily occur in the OFF state and the blocking voltage drops. Moreover, lowering the p body region concentration tends to extend the depletion layer within the p body region during the OFF state so that the same drop in blocking voltage occurs.

However one method for lowering the threshold voltage without causing a drop in blocking voltage is known that utilizes a structure in which only the trench side wall vicinity in the p body regions is set to a low concentration. The threshold voltage can be lowered without a drop in blocking voltage by lowering the concentration only around the oxidized film boundary that affects the threshold voltage. Methods for forming this structure include a method that lowers the P density on the surface by ion implantation of n-type impurities, and a method for forming n-type impurities by epitaxial growth towards the trench side wall. The former method damages the channels due to ion implantation so that not only is there a drop in mobility but also a possible deterioration in oxidized film reliability. The latter method required in-process epitaxial growth, yet forming an epitaxial layer on a surface roughened by dry etching is difficult and also has many problems in terms of cost and technical issues.

Figure 1:
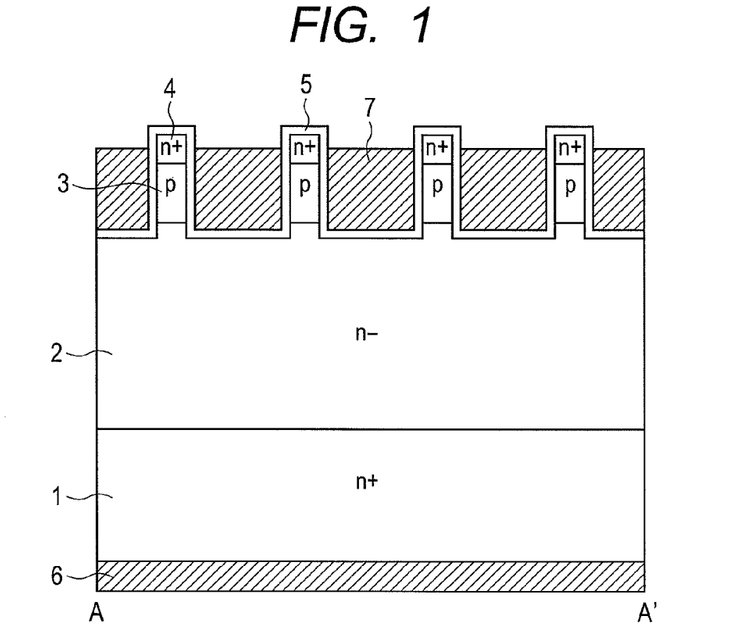
FIG. 1 is a drawing showing a portion of the cross sectional structure of the semiconductor device of the first embodiment of this invention.

A technology describing a double-gate DMOSFET with structure resistant to punch-through between the source region and drift layer is disclosed in Japanese Patent No. 3319215. This structure as shown in FIG. 1 is a channel extending horizontally in parallel with the substrate surface and enclosed from above and below by two gates. The lower gate acts to prevent an electrical field from forming on the channel and in this way helps resist punch-through between the source region and drift layer. However, since the channels in this structure extend laterally, the cell pitch is wide so the cell integration is not dense enough and consequently the specific ON-resistance cannot be lowered sufficiently. Another problem is that the lower gate electrode must be embedded creating a more costly production process. Moreover this document gives no description whatsoever of the interrelation of p body dimension, p body width and dopant concentration.

Though the structure is different from a power MOSFET, the technology disclosed in JP-A-Hei05 (1993)-110091 describes a double-gate structure TFT (Thin Film Transistor) with a 2000 (0.2 µm) angstrom gap between the gate electrodes as a structure resistant to punch-through between the source and drain and that allows higher current flow. In this double-gate TFT with thin channels, the total channel region is inverted, a large ON current can be obtained and there is no increase in OFF current even in short channels (paragraphs 0006-7, paragraph 0017, see FIG. 1). However this document discloses no technology relating to vertical power MOSFET, and also gives no description of the relation between the body region enclosed by trenches formed on both sides of the channel forming regions in the UMOSFET, the width of the body region enclosed by the trenches, and the dopant concentration, etc.

SUMMARY OF THE INVENTION

Problems with the background art as described above when attempting to form a UMOSFET are therefore that the channel mobility is low, and currently there are no effective measures for lowering the threshold voltage without causing a drop in the blocking voltage.

Main aspects of the UMOSFET of the present invention are a uniform impurity concentration set to $5 \times 10^{17}$ cm$^{-3}$ or less within the trenches and the p body region enclosed by the trenches, a region width of 0.1 μm or more and 0.5 μm or less. Moreover the most significant aspect of this invention is a p body region whose width is narrower than the total depletion layer width (maximum depletion layer width) from both channels in an inverted state.

(1) A first aspect of this invention includes: a low resistance first conducting type semiconductor substrate serving as the drain layer, and a first main electrode connected to the backside of the semiconductor substrate, an epitaxial layer formed on the semiconductor substrate and whose resistance is higher than the first conducting type semiconductor substrate, a second conducting type body region formed within the epitaxial layer, a source layer formed on the body region, and with a low resistance approximately equal to the first conducting type semiconductor substrate, a body connecting layer connecting to the body region, and whose resistance is lower than the second conducting type body region formed on the semiconductor substrate surface and, a second main electrode connected to the source layer and on the body connecting layer, trenches formed so as to penetrate through the body region and the source layer, a gate insulating film formed on the bottom and the side walls of the trench, and a third main electrode on the inside of the trench and connecting to a portion of the source layer and the entire surface of the body region by way of the gate insulating film in which, at least two different types of body region widths are enclosed between the trenches, and the wide area of the body region width has a higher concentration than the narrow area of the body region width.

(2) In the above (1) of the first aspect, among the body regions, the concentration in the area around the gate insulation film is preferably lower than the concentration in areas isolated from the gate insulation film.

(3) In the above (1) of the first aspect, the narrow area of the body region width is preferably 0.1 μm or more and 0.5 μm or less.

(4) In the above (1) of the first aspect, the narrow area of the body region width is preferably narrower than the sum of the maximum depletion layer width extending by way of the gate insulating film from both sides of the third main electrode.

(5) In the above (1) of the first aspect, the source layer preferably contacts the body connecting layer along the wide area of the body region width.

(6) In the above (1) of the first aspect, the wide area of the body region width and the narrow area of the body region width are both preferably mutually straight and formed as rectangles.

(7) In the above (1) of the first aspect, the wide areas of the body region width are preferably arranged in a matrix consisting of rectangles or squares, and the narrow areas of the body region width are preferably placed so as to mutually connect the wide areas of the body region width.

(8) In the above (1) of the first aspect, the material of the semiconductor substrate and the epitaxial layer are preferably selected from silicon carbide or gallium nitride.

(9) In the above (1) of the first aspect, the dopant is preferably aluminum.

(10) A second aspect of the invention includes the following features:

(a) a process to form an epitaxial layer whose resistance is higher than the first conducting type semiconductor substrate, on the low-resistance first conducting type semiconductor substrate, (b) a process to form a second conducting type body region within the epitaxial layer, (c) a process for forming a source layer with the same approximate low resistance as the first conducting type semiconductor substrate, on the body region, (d) a process to form a body connecting layer whose resistance is lower than the second conducting type body region on the semiconductor substrate surface so as to connect to the body region, (e) a process to form a trench so as to penetrate through the body region and the source layer, and (f) a process to form a gate insulating film on the side walls and bottom of the trench, in which, at least two or more different types of body region widths are formed enclosed between the trenches, and ion implantation is performed so that the wide area of the body region width has a higher dopant concentration than the narrow area of the body region width.

(11) In the above (10) of the second aspect, among the body regions, the concentration in the area around the gate insulation film is preferably lower than the concentration in areas isolated from the gate insulation film.

(12) In the above (10) of the second aspect, the narrow area of the body region width is preferably 0.1 μm or more and 0.5 μm or less.

(13) In the above (10) of the second aspect, the narrow area of the body region width is preferably narrower than the sum of the maximum depletion layer widths extending by way of the gate insulating film from both sides of the third main electrode.

(14) In the above (10) of the second aspect, the source layer preferably contacts the body connecting layer along the wide area of the body region width.

(15) In the above (10) of the second aspect, the wide area of the body region width and the narrow area of the body region width are both preferably mutually straight and formed as rectangles.

(16) In the above (10) of the second aspect, the wide areas of the body region width are preferably arranged in a matrix consisting of rectangles or squares, and the narrow areas of the body region width are preferably placed so as to mutually connect the wide areas of the body region width.

(17) In the above (10) of the second aspect, the material of the semiconductor substrate and the epitaxial layer are preferably selected from silicon carbide or gallium nitride.

(18) In the above (10) of the second aspect, the dopant is preferably aluminum.

This invention is capable of maintaining a low threshold voltage by setting a p body region concentration of $2 \times 10^{17}$ cm$^{-3}$ or less, and further capable of maintaining the blocking voltage with no punch-through between the source and drift regions by making the width of the p body region narrower than the p body region depth (channel length). Moreover, by making the p body region width narrower than the sum of depletion layer widths (maximum depletion layer width) from channels on both sides in an inverted state, the p body region can be fully depleted until an inverted layer is attained, and the threshold voltage lowered even further.

The present invention is capable of rendering a semiconductor power device containing UMOSFET possessing large channel mobility and whose threshold voltage can be lowered with no loss in blocking voltage.

DETAILED DESCRIPTION OF THE PREFERRED EMBODIMENTS

First Embodiment

Figure 2:
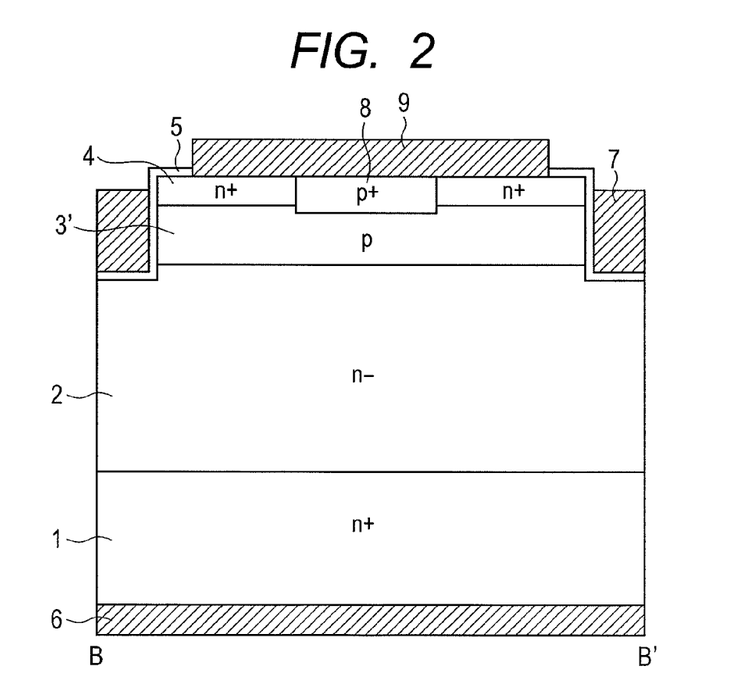
FIG. 2 is a drawing showing a portion of the cross sectional structure of the semiconductor device of a first embodiment of this invention.
Figure 3:
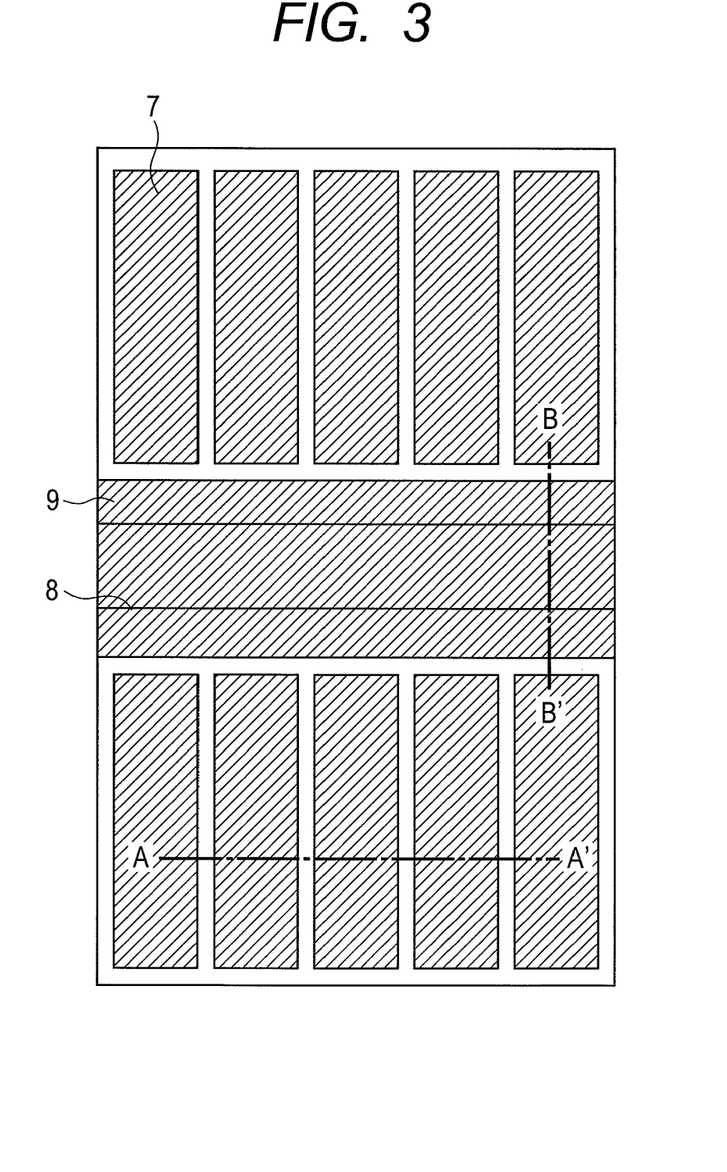
FIG. 3 is a flat layout view of the semiconductor device of the first embodiment of this invention.

The embodiments of this invention are described next while referring to the drawings. FIG. 1 and FIG. 2 are drawings showing the cross sectional structure of the UMOSFET of this invention. FIG. 3 is a drawing showing a flat layout view of the UMOSFET of this invention. The section taken along lines A-A' in FIG. 3 is the same cross section in FIG. 1; and the section taken along lines B-B' is the same cross section as in FIG. 2. A drift region 2 for the n⁻ epitaxial layer is formed on the drain region 1 of the n⁺ substrate formed from silicon carbide as the base material. A p body region 3 and an n⁺ source region 4 are respectively formed on the drift region 2, and trenches are formed so as to pierce through the n⁺ source region 4 and the p body region 3. A gate insulating film 5 made from oxidized film is formed on the upper section of the source region 4 and of the bottom and side walls of the trench; and a gate electrode 7 is embedded within the trench via this gate insulating film 5. A drain electrode 6 is formed on the back side of the substrate. The trenches within the substrate surface are rectangular, and are arrayed at fixed intervals. The long side of the rectangle is extremely close to the adjacent trench but the short side is separated from the adjacent trench. A p⁺ region 8 for clamping the voltage potential of p body region 3 is formed between these isolated short sides, and the source electrode 9 is also formed in this region. The p body region concentration is thinner in the narrow area 3 of the p body region width compared to the wide area 3'.

The operation of this embodiment is described next. A voltage between 100 volts to several hundred kilovolts is first of all applied to the drain while in a blocking state with 0 volts or a negative voltage applied to the gate. The p body region between the source and drain acts as a barrier at this time so that electrical current cannot flow. If the p body region thickness or in other words the channel length is short or the body concentration is thin at this time, then the p body region fully depletes, punch-through occurs and electrical current flows. In this embodiment, the wide area 3' of the p body region width is set to a high concentration to prevent punch-through and to maintain a blocking voltage. The narrow area 3 of the p body region on the other hand is set to a thinner concentration than the wide area 3' of the p body region. Punch-through usually occurs when the p body region concentration is too thin but in this embodiment, the width of the p body region 3 is extremely narrow so the p body region 3 potential is clamped from the gates on both sides so no punch-through will occur. In other words, the threshold voltage can be maintained even if the concentration in the p body region 3 is thinner than usual. On the other hand, applying a positive (plus) voltage potential to the gate in an ON state causes inversion in the trench side walls and generates carriers in the channel. Applying a voltage potential of about 1 volt to the drain in this state causes a large current flow from the source to the drain. A large differential occurs at this time in current-carrying capacity of the wide area 3' and narrow area 3 on the p body region. This differential occurs because of the high concentration on the p body region in wide area 3' where the higher threshold voltage causes a large channel resistance. The p body region concentration on the narrow area 3 on the other hand is low so the threshold voltage lowers and a large current can flow. Moreover, in this embodiment, making the width of the p body region 3 narrow causes full depletion of p body region area 3 prior to forming an inversion layer when a positive voltage is applied to the gate so that the threshold voltage can be lowered even further and a large current can flow. The narrow area 3 of the p body region width can therefore handle a larger current flow compared to the wide area 3', however a narrow p body region cannot make contact with the source, so even though its resistance is large, a wide area 3' of the p body region is formed to make contact with the source.

This embodiment assumes use of a blocking voltage in the 600 volt class, drift layer concentration of $2 \times 10^{16}$ cm$^{-3}$, a thickness of 6 μm, a trench depth of 1 μm, and a width of about 1 μm. The width of the p body region in the narrow area is 300 nm, the concentration is $1 \times 10^{17}$ cm$^{-3}$, the width of the wide area is 2 μm, and the concentration is approximately $1 \times 10^{18}$ cm$^{-3}$. Aluminum is used as the dopant. How MOSFET characteristics vary depending on the width and concentration of the p body region is described in detail later on. Nitrogen is utilized in the source region as an n⁺ dopant. The impurity concentration is approximately $10^{20}$ cm$^{-3}$. The gate oxidation film is SiO$_2$ that is carrier vapor deposited (CVD) on thermally oxidized film in thicknesses of 50 nm on the trench side walls, and approximately 100 nm on the trench bottom and substrate surface. The method for forming the oxidized film has not yet been optimized so mobility is currently limited to approximately 10 cm$^2$/Vs. Polysilicon is utilized as material for the gate electrode, and nitrogen (Ni) is sputtered onto Ni-silicide as the backside electrode material.

The method for fabricating the present embodiment is described next using FIG. 4 through FIG. 6. An n$^-$ epitaxial layer 2 and a p-epitaxial layer for the p body region 3 are first of all made to develop on the n$^+$ substrate 1. The n$^+$ substrate plane is orientated at an angle offset 8 degrees from the Si plane, the plane may also be oriented on the C plane or on the (11-20) plane, and the offset angle may be even 4 degrees or 0 degrees as long as the epitaxial layer can develop uniformly. However, performing ion implantation perpendicularly at an offset angle of 0 degrees requires caution since the impurities sometimes penetrate deeply due to channeling. Silicon oxide is next deposited, and the silicon oxide then processed by lithography and dry etching. The processed silicon oxide is then utilized as a hard mask to form a p region by ion implantation serving as the termination region. The ion type is aluminum and in a concentration of approximately $1 \times 10^{17}$ cm$^{-3}$. The termination region is formed by multi-stage implantation at a maximum 500 keV because a depth equivalent to the trenches is needed in order to prevent a concentrated electrical field at the trench corners. The present embodiment employs a JTE (Junction Termination Extension) structure however a guard ring structure or other structure may be utilized. The termination region does not directly relate to this invention and so does not appear in the drawings.

Figure 4:
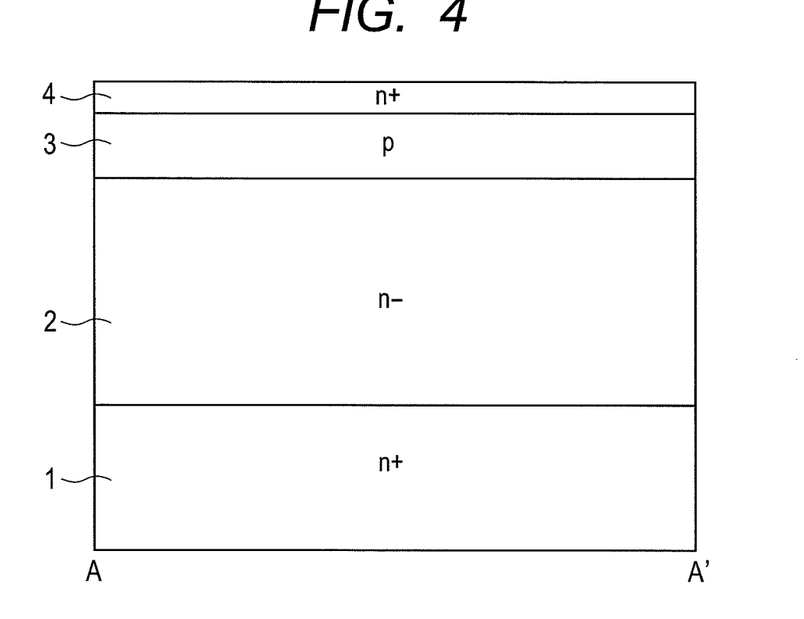
FIG. 4 is a drawing showing the method for manufacturing the semiconductor device of the first embodiment of this invention.
Figure 5:
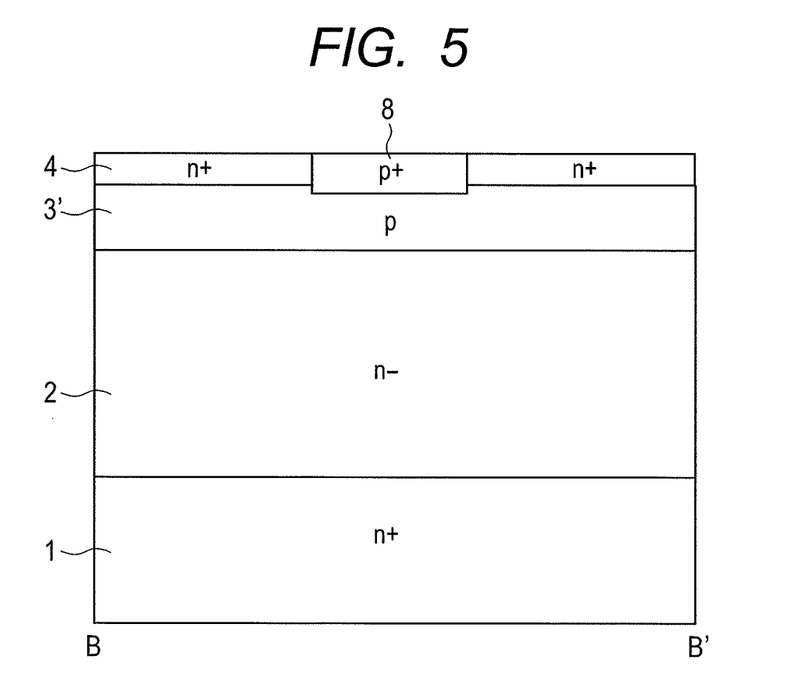
FIG. 5 is a drawing showing the method for manufacturing the semiconductor device of the first embodiment of this invention.

Next, a p body region 3' with a thicker concentration than the body region 3 of the p epitaxial layer; and a p$^+$ region 8 for clamping the voltage potential of the p body region and the n$^+$ region serving as the source region 4 are formed as shown in FIG. 4 and FIG. 5 by the same method as used for forming the termination region. The n$^+$ region formed over the entire surface in FIG. 4 however is not actually formed on the termination region and contact region of the gates. In order to lower the sheet resistance, the ion types used were nitrogen for n$^+$ and aluminum for p$^+$, and the n$^+$ ion implantation was performed at 500 degrees in order to lower the leak current in the pn junction.

Figure 6:
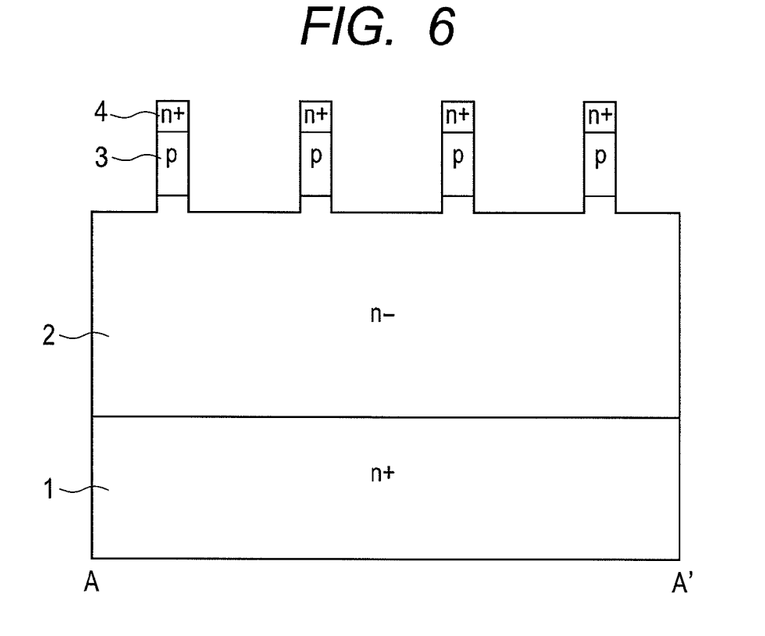
FIG. 6 is a drawing showing the method for manufacturing the semiconductor device of the first embodiment of this invention.
Figure 7:
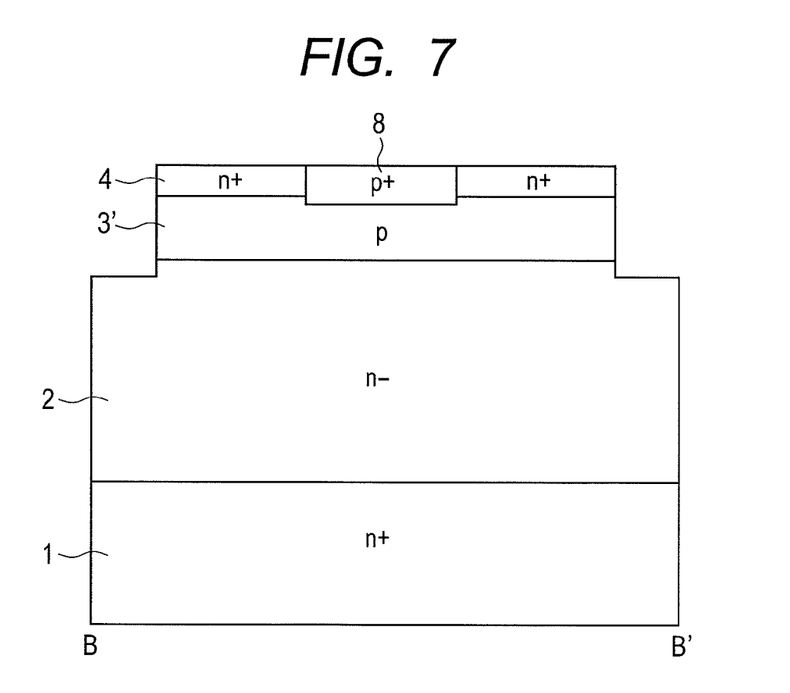
FIG. 7 is a drawing showing the method for manufacturing the semiconductor device of the first embodiment of this invention.
Figure 8:
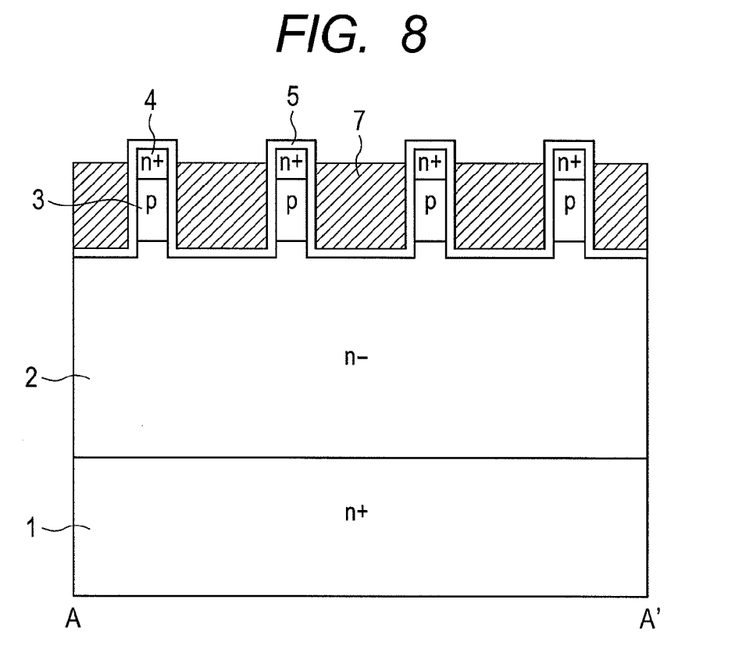
FIG. 8 is a drawing showing the method for manufacturing the semiconductor device of the first embodiment of this invention.
Figure 9:
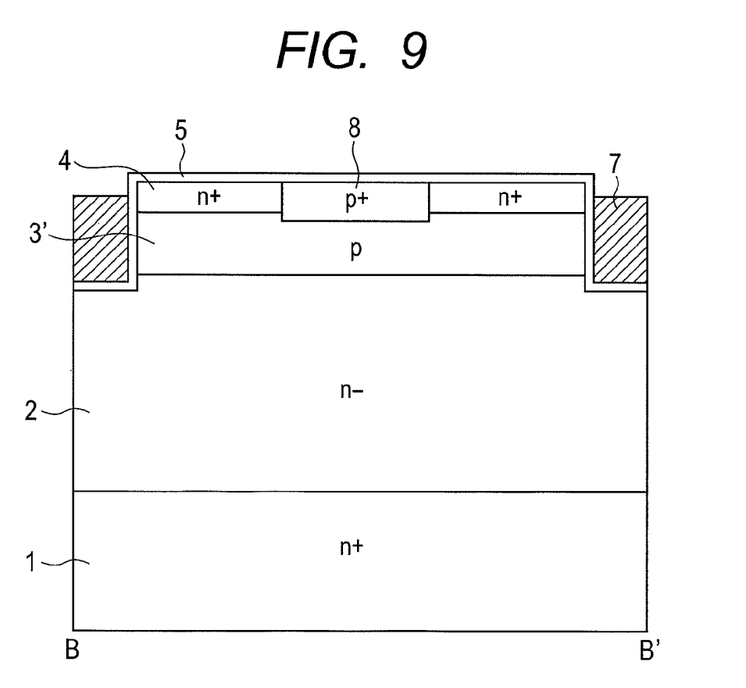
FIG. 9 is a drawing showing the method for manufacturing the semiconductor device of the first embodiment of this invention.

Next, as shown in FIG. 6 and FIG. 7, silicon oxide was deposited, and was processed by lithography and dry etching, and trenches formed by dry etching using this processed silicon oxide as a hard mask. The trench should at this time be formed as perpendicular (upright) as possible in order to maintain the p body region at a specified width. A carbon film was then formed to prevent surface roughness, and activation annealing performed at 1700 degrees. The carbon was then removed by an oxygen asher. To form the gate oxidation film, the surface was oxy-nitrided by N$_{20}$ oxidization at 1250° C. and an SiO$_2$ film deposited by CVD (carrier vapor deposition). The film thickness on the trench bottom must be made thick compared to the trench side walls at this time in order to prevent insulation breakdown at the trench corners, so conditions were selected that made forming layers on the side walls by CVD difficult. The final film thickness finish was set to approximately 50 nm for the trench side walls and approximately 100 nm for the trench bottom. Highly concentrated polysilicon serving as the gate was next formed on the interior of the trench. Implantation was performed by depositing a film by CVD and by etchback, however even planarizing techniques such as CMP (Chemical Mechanical Polishing) may be utilized.

The contact for the surface and backside was next formed using an alloy containing nickel as the main element. Contact holes were next formed in the surface by lithography and dry etching, silicide was formed by depositing nickel (Ni) and by silicide annealing at 1,000 degrees, and finally the non-reactive metal stripped away. Silicide was also formed on the backside by depositing nickel (Ni) and performing silicide annealing at 1000 degrees. Finally, aluminum dual layer wiring using silicon oxide as the interlayer insulator film was formed, and holes formed in the source pad and gate pad to complete the device.

In this embodiment, the p type impurity was aluminum and the n type impurity was nitrogen, however the p impurity may be boron and the n impurity may be phosphorus. Boron has a light mass and can therefore be deeply implanted at a low energy, and phosphorus can boost the nitrogen concentration. However, outward diffusion of boron lowers the concentration near the surface so some manner of countermeasure is needed for additional implantation of aluminum on the surface, and caution is also needed when using phosphorus since it causes numerous crystalline defects.

Figure 10:
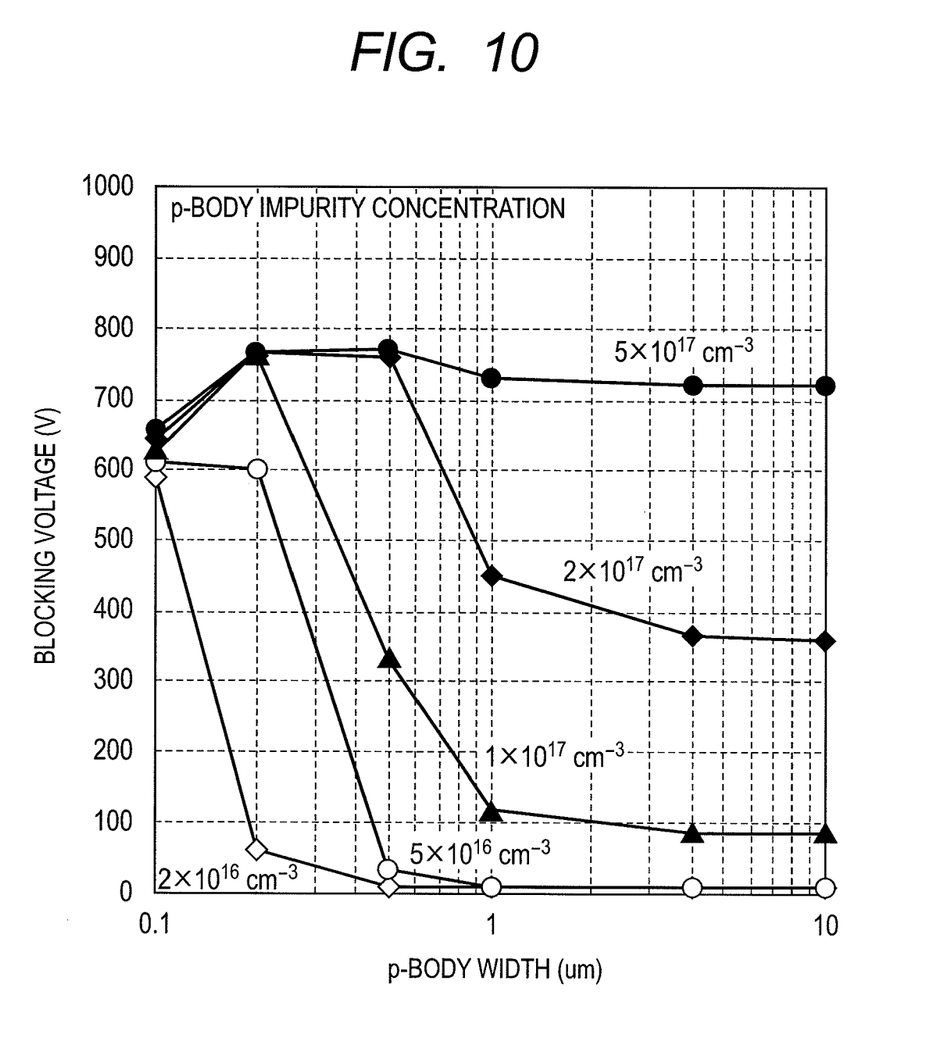
FIG. 10 is a drawing showing the relation between the p body region 3 width and the blocking voltage in the semiconductor device of the first embodiment of this invention.

The basis for deciding the extremely critical p body region concentration and width in this invention are described next. FIG. 10 shows the blocking voltages when the concentration and width of the p body region are varied. As can be seen from the drawing, the blocking voltage shows virtually no dependence on p body region width when the p body region width is 1 μm or more. The blocking voltage on the other hand rises sharply when the p body region width is 0.5 μm or less. This rise in blocking voltage occurs because the p body potential is clamped by the gate voltage potential on both sides when the p body region width is narrow, making it difficult for the depletion layer to widen within the p body region. Conversely, narrowing the p body region width to 0.1 um or less sometimes causes a drop in the blocking voltage. The electrical field normally tends to concentrate at the trench corners in the blocking state, however when the p body region is too narrow the electrical field might overlap at certain points on the trench corners, making the electrical field even more intense. One can see from the above information that the p body region width should be an optimal value to obtain a correct blocking voltage.

Figure 11:
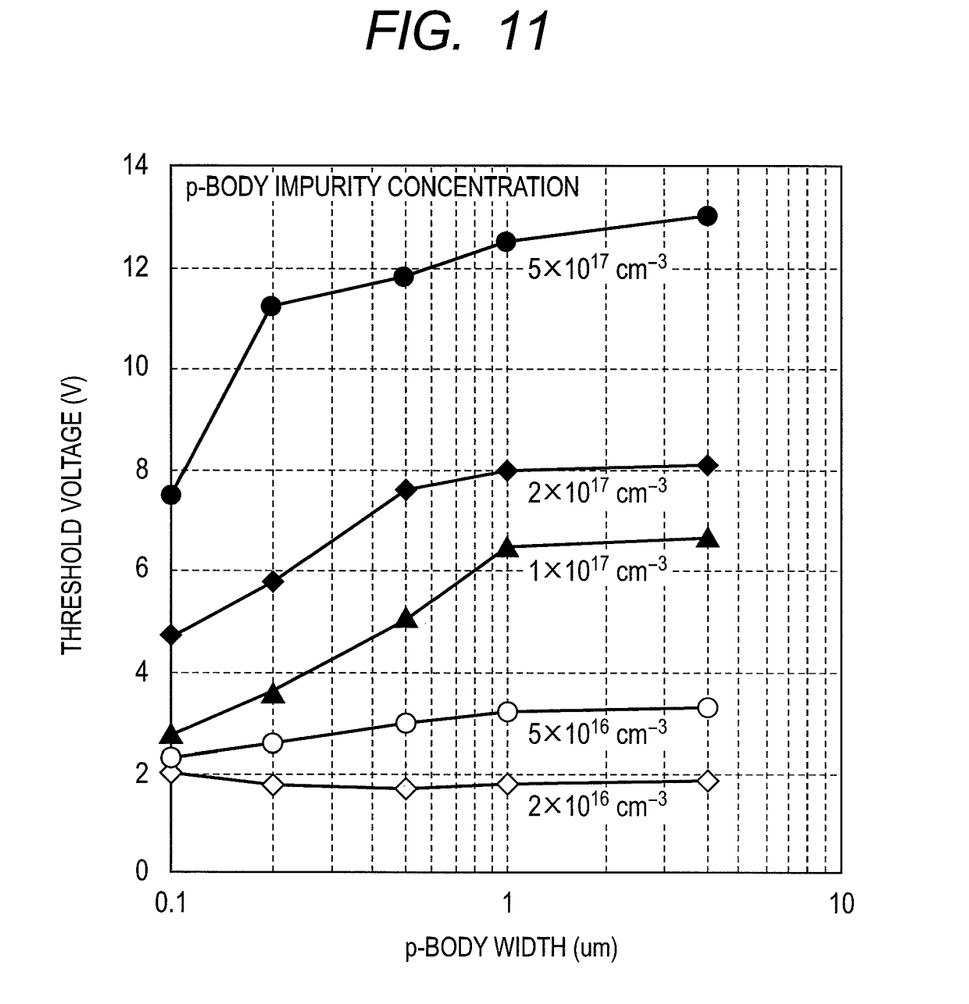
FIG. 11 is a drawing showing the relation between the p body region 3 width and threshold voltage in the semiconductor device of the first embodiment of this invention.

FIG. 11 next shows the threshold voltage and the concentration and width of the p body region. Examining the drawing reveals that the threshold voltage lowers at the point where the width of the p body region narrows. However the point where the threshold voltage starts to drop will vary according to the p body region concentration. The reason this point varies is that threshold voltage drop is caused by full depletion within the p body region before an inversion layer can form in the channel. In other words, a phenomenon occurs where the threshold voltage drops when the width of the p body region is narrower than the sum of the maximum depletion widths extending from the gates on both sides. The above relation demonstrates that setting the p body range width between approximately 0.1 μm to 0.5 μm, and the concentration from approximately $1 \times 10^{17}$ cm$^{-3}$ to $2 \times 10^{17}$ cm$^{-3}$ will attain a large current flow and lower the threshold voltage while maintaining the blocking voltage. The p body region utilized in the present embodiment has a width of 0.2 μm, and concentration of $1 \times 10^{17}$ cm$^{-3}$. However making contact with the source is difficult when the p body region width is 0.2 μm so a separate region is formed for contacting the source. This region utilizes a width of approximately 4 μm as the width of the p body region so in view of the previous relation, a concentration of about $5 \times 10^{17}$ cm$^{-3}$ is utilized. Here, contact cannot be made across the entire region directly above the source so the dimension along the depth must be determined by allowing for the source resistance.

Figure 12:
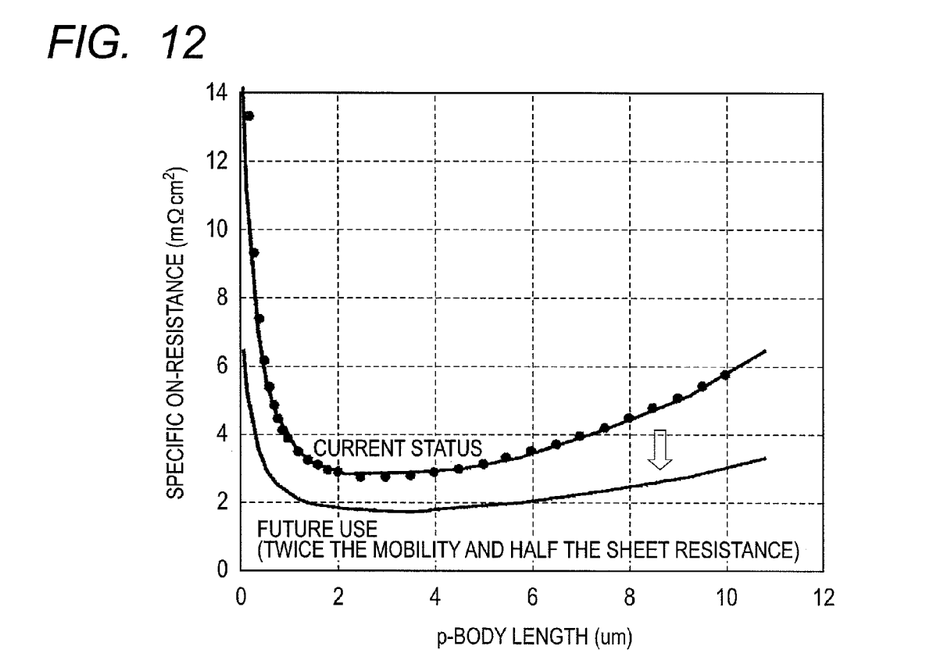
FIG. 12 is a drawing showing the relation between the p body region 3 depth and the specific ON-resistance in the semiconductor device of the first embodiment of this invention.

FIG. 12 is a drawing showing the relation between the source resistance and the depth of p body region 3 having a narrow width. The n⁺ sheet resistance is approximately $10^3 \Omega/\square$. A short depth lowers the source resistance however the effective surface area is also reduced so the channel resistance increases. Conversely, making the depth longer lowers the channel resistance but the source resistance becomes large. A total resistance of 2.7 mΩ·cm² was attained at a depth of approximately 2 μm as the optimal value. However caution is required here because the ideal depth value changes according to the sheet resistance and channel mobility. Implementing this embodiment will also likely halve ($5 \times 10^2 \Omega/\square$) the currently utilized sheet resistance and double (20 cm/Vs) the channel mobility so that a total specific ON-resistance within 2 mΩ·cm² will likely be obtained.

Figure 13:
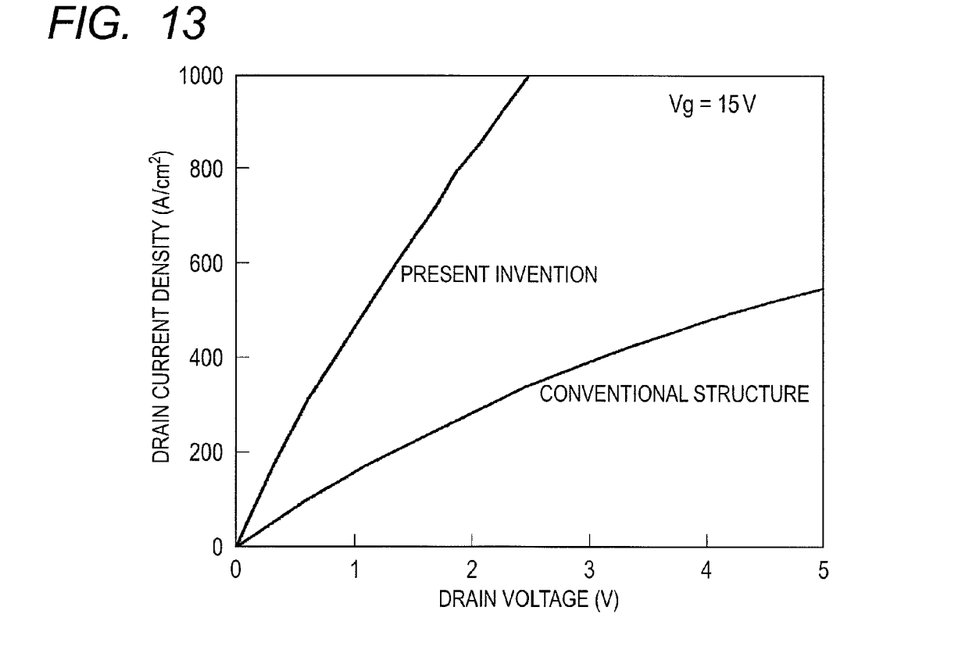
FIG. 13 is a drawing showing characteristics of the semiconductor device of the first embodiment of this invention.

The effect rendered by this embodiment is next described in terms of characteristics using FIG. 13. This figure shows the current density under conditions where a blocking voltage of 600 volts or higher is maintained. The graph in the figure shows the case where a p body region of the conventional art is wide (4 μm) and the case of this embodiment where the width was set at 0.2 μm. This embodiment attained a current density twice or more that of the conventional art. However as was already related, an even larger current can likely be achieved by improving the n⁺ sheet resistance and the channel mobility.

Second Embodiment

Figure 14:
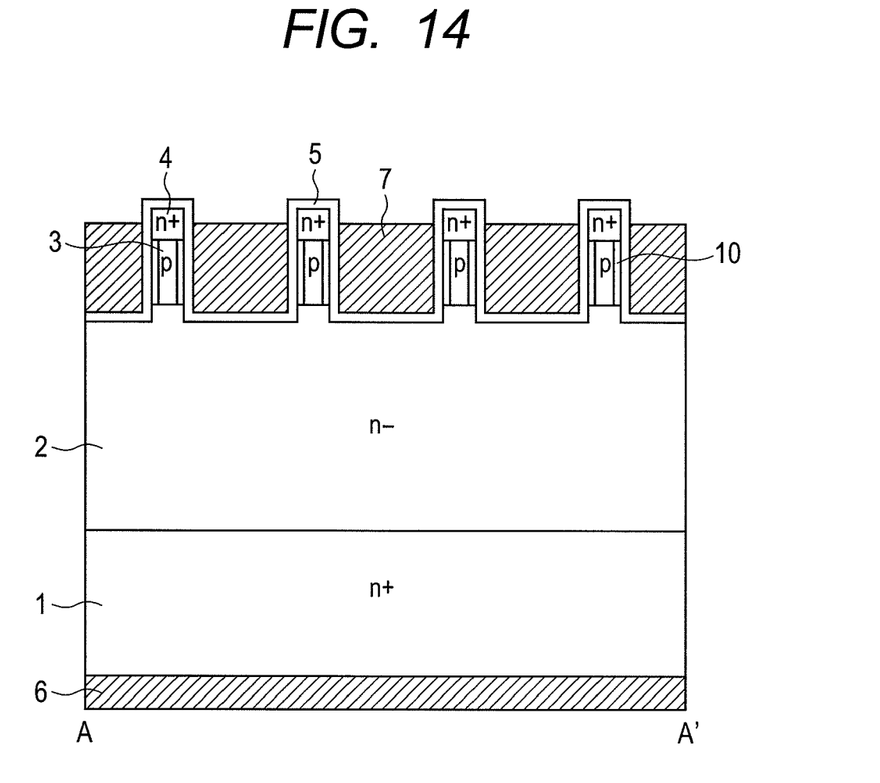
FIG. 14 is a drawing showing the cross sectional structure of the semiconductor device of a second embodiment of this invention.

FIG. 14 shows a cross sectional structural view of the second embodiment. The second embodiment differs from the first embodiment in the point that due to channel doping, the channel concentration is lower than the p body region 3 concentration near the trench side walls. Forming a channel layer 10 with a concentration lower than the p body region 3 allows using a lower threshold voltage than the first embodiment and also allows raising the current density.

The fabrication process for the present embodiment is basically the same as the first embodiment and differs only in the point that the channel layers were formed by sloped ion implantation after forming the trenches. The condition for sloped ion implantation was 15 keV at a dosage of $5 \times 10^{11}$ cm⁻². All other design values were the same as the first embodiment. Channel doping was used to form channel layers of $5 \times 10^{16}$ cm⁻³ at a width of approximately 50 nm from the trench side walls. Special characteristics were a drop in the threshold voltage of approximately 0.5 volts and about a 20 percent improvement in the current density compared to the first embodiment while maintaining a 600 volt blocking voltage. Caution is however required because excessive channel doping not only lowers the blocking voltage but also reduces the channel mobility which causes the reliability of the gate insulating film to deteriorate.

Third Embodiment

Figure 15:
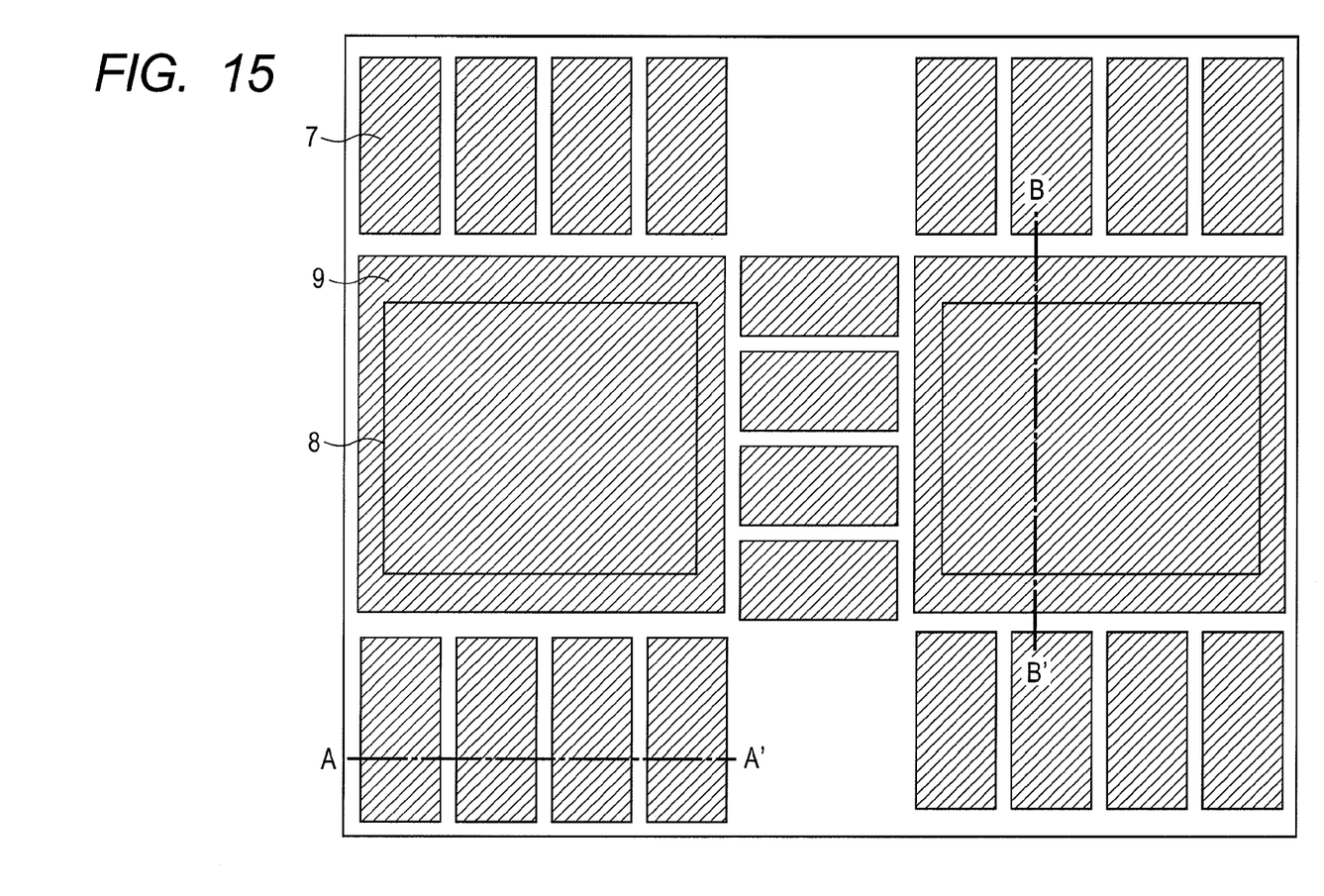
FIG. 15 is a planar structural view of the semiconductor device of a third embodiment of this invention.

The third embodiment of this invention is described next utilizing the device planar structural view shown in FIG. 15. The point where this embodiment differs from the first embodiment is the position relation of the wide area 3' and narrow area 3 on p body region. In the first embodiment, the wide area 3' and narrow area 3 of the p body region width are arrayed in straight line relative to each other. In the layout of the present embodiment however, the wide areas 3' of the p body region width are in a matrix, and the narrow areas 3' of the p body region width connect between them.

The operation and method for fabricating the present embodiment are the same as the first embodiment. However the optimal embodiment for use depends on the circumstances. The present embodiment for example is superior in terms of surface area when the width of the wide area 3' of the p body region is wider than the depth of narrow area 3 of the body region. In the first embodiment, the width of wide area 3' of the p body region is 4 μm, and the depth of the narrow area 3 of p body region is 2 μm, so the surface area of the p body region width of narrow area 3 in this (third) embodiment is increased approximately 30 percent compared to the first embodiment and the channel resistance is also lower. On the other hand, the first embodiment is superior under circumstances where a low source resistance can be maintained even if the n⁺ sheet resistance, is lowered, and the depth of narrow area 3 of the p body region is long.

One can also easily envisage a combination of the first and third embodiments and under certain circumstances this combination may prove optimal. Moreover, a silicon carbide substrate was described in the examples in the above embodiments however semiconductors such as silicon or gallium nitride may also be applied.

The present invention is therefore capable of providing a power semiconductor device formed from UMOSFET possessing large channel mobility and whose threshold voltage can be lowered with no loss of blocking voltage.

What is claimed is:

1. A semiconductor device comprising:
   a low resistance first conducting type semiconductor substrate serving as a drain layer;
   a first main electrode connected to a backside of the semiconductor substrate;
   an epitaxial layer formed on the first conducting type semiconductor substrate and whose resistance is higher than the first conducting type semiconductor substrate;
   a second conducting type body region formed within the epitaxial layer;
   a plurality of source layer regions formed on the second conducting type body region, and with a low resistance approximately equal to the first conducting type semiconductor substrate;
   a body connecting layer formed in the epitaxial layer and connecting to the second conducting type body region, and whose resistance is lower than the second conducting type body region,
   a second main electrode formed on and in electrical contact with a first source layer region and a second source layer region of the plurality of source layer regions and the body connecting layer;
   trenches formed so as to penetrate through the second conducting type body region and the plurality of source layer regions; and
   a gate insulating film formed on bottom and side walls of each trench;
   a respective third main electrode formed within each trench and insulated by way of the gate insulating film from a sidewall portion of the respective source layer region and a sidewall of the body region adjacent to the trench,
   wherein a width of a first portion of the second conducting type body region between trenches that are adjacent in a first direction is greater than a width of a second portion of the second conducting type body region between trenches that are adjacent in a second direction perpendicular to the first direction,
   the first portion of the second conducting type body region has a higher dopant concentration than the second portion of the second conducting type body region,
   the body connecting layer is arranged between the first and second source layer regions in plan view and on the first portion of the body region, and the first portion of the second conducting type body region has a lower dopant concentration than the body connecting layer.

2. The semiconductor device according to claim 1, wherein a dopant concentration in an area of the second portion of the second conducting type body region closer to the gate insulating film is lower than a dopant concentration in areas of the second portion of the second conducting type body region farther from the gate insulating film.

3. The semiconductor device according to claim 1, wherein said width of the second portion of the second conducting type body region is between 0.1 μm and 0.5 μm, inclusive.

4. The semiconductor device according to claim 1, wherein said width of the second portion of the second conducting type body region is less than a sum of maximum depletion layer widths extending from the gate insulating film of the respective third main electrodes on both sides of the second portion of the second conducting type body region.

5. The semiconductor device according to claim 1, wherein an upper surface of the first portion of the second conducting type body region contacts the first and second source layer regions of the plurality of source layer regions and the body connecting layer.

6. The semiconductor device according to claim 1, wherein the first portion of the second conducting type body region and the second portion of the second conducting type body region are both formed as rectangles and having long sides perpendicular to each other.

7. The semiconductor device according to claim 1, wherein said first portion of the second conducting type body region is one of a plurality of first portions of the second conducting type body region arranged as a matrix of rectangles, and said second portion of the second conducting type body region is one of a plurality of second portions of the second conducting type body region placed so as to interconnect said plurality of first portions of the second conducting type body region.

8. The semiconductor device according to claim 1, wherein the material of the first conducting type semiconductor substrate and the epitaxial layer are selected from silicon carbide, silicon, or gallium nitride.

9. The semiconductor device according to claim 2, wherein the dopant is aluminum.

* * * * *